United States Patent [19]

Kondo

[11] Patent Number: 5,187,382
[45] Date of Patent: Feb. 16, 1993

[54] APPARATUS FOR DETECTING THE EXISTENCE OF AN ABNORMALITY IN A VEHICLE OPERATOR PROTECTION SYSTEM

[75] Inventor: Akira Kondo, Okazaki, Japan
[73] Assignee: Nippondenso Co., Ltd., Kariya, Japan
[21] Appl. No.: 684,767
[22] Filed: Apr. 15, 1991
[30] Foreign Application Priority Data
Apr. 16, 1990 [JP] Japan ................... 2-100131
[51] Int. Cl.⁵ .............................. B60L 3/00
[52] U.S. Cl. ...................... 307/10.1; 307/64
[58] Field of Search ............. 307/64, 67, 9.1, 10.1; 280/727, 728, 734, 735; 180/271, 282, 274; 340/436, 438

[56] References Cited

U.S. PATENT DOCUMENTS

| | | | |
|---|---|---|---|
| 4,287,431 | 9/1981 | Yasui et al. | 307/10.1 |
| 4,835,513 | 5/1989 | McCurdy et al. | 307/10.1 |
| 5,045,835 | 9/1991 | Masegi | 307/10.1 |

FOREIGN PATENT DOCUMENTS

| | | |
|---|---|---|
| 0343578 | 11/1989 | European Pat. Off. . |
| 0344788 | 12/1989 | European Pat. Off. . |
| 3743961 | 7/1989 | Fed. Rep. of Germany . |
| 3802159 | 8/1989 | Fed. Rep. of Germany . |
| 3806694 | 9/1989 | Fed. Rep. of Germany . |
| 55-44912 | 11/1980 | Japan . |
| 8904779 | 6/1989 | PCT Int'l Appl. . |

Primary Examiner—Jeffrey A. Gaffin
Attorney, Agent, or Firm—Cushman, Darby & Cushman

[57] ABSTRACT

A vehicle operator protection system capable of detecting abnormalities in an auxiliary power supply in the protection system. The auxiliary power supply comprises a backup capacitor which is part of a time constant circuit and is connected in parallel with an actuator for inflating an air bag. While the backup capacitor is charged, the voltage differences between an onboard battery and the backup capacitor are determined for a given period, and the determined value is divided by the amount that the voltage of the backup capacitor rises in the given period. An abnormality in the capacitance of the backup capacitor is determined in accordance with the divided value, and thus the abnormality of the capacitance of the backup capacitor can be detected accurately without being influenced by variation of voltage of the onboard battery.

14 Claims, 5 Drawing Sheets

APPARATUS FOR DETECTING THE EXISTENCE OF AN ABNORMALITY IN A VEHICLE OPERATOR PROTECTION SYSTEM

BACKGROUND OF THE INVENTION

1. Field of the Invention

The present invention relates to a vehicle operator protection system such as an air bag system and more particularly to a system for determining the existence of an abnormality in a backup circuit for supplying power to the actuating device for actuating the protection system.

2. Description of the Prior Art

In a conventional air bag system, a chargeable device (for example, backup capacitor) is installed in parallel with an actuating device of the air bag system to insure that the air bag system would be actuated even if the battery of the vehicle becomes inoperable due to a collision or the like.

The backup capacitor is charged by the battery while the battery is operating normally, and when the battery becomes inoperable in a collision or the like, the backup capacitor in place of the battery may energize the actuating device by discharging the electric charge that has been stored therein while the battery was operating normally.

Therefore, it is necessary to determine the value of the static capacitance of the backup capacitor to determine whether or not the capacitor it can store the amount of charge necessary to actuate the actuating device.

In order to make that determination, Japanese patent publication No. 44912/1980 discloses that (1) the period for the backup capacitor to attain a predetermined voltage is compared with the required amount of time that the backup capacitor must be connected to the battery, or (2) the time-charging voltage characteristics diagram of a circuit having a standard time constant is compared with the time-charging voltage characteristics diagram of the circuit having a particular time constant.

According to the prior art, a deterioration either in the backup capacitor itself, or in the performance of the charging of the backup capacitor (for example, performance deterioration due to increase of leakage resistance) can be determined.

However, the purpose of the backup capacitor is to maintain a voltage sufficient to actuate the air bag device, even when the battery fails for any reason or the battery terminal becomes disconnected. Therefore, it is necessary to determine if there is any abnormality in the static capacitance of the backup capacitor that would prevent it from storing a voltage large enough to actuate the air bag system reliably.

When the backup capacitor is charged by the battery voltage and the time necessary to attain a predetermined voltage is compared to a required time as in the prior art, because the backup capacitor connected to the battery is susceptible to variation of the battery voltage, high precision abnormality determination of the static capacitance of the backup capacitor can not be attained.

Also, when a variation of charging voltage in a standard time constant circuit is compared to a variation in charging voltage of the backup capacitor, special expensive elements are needed, as it is necessary to use relatively new elements operating at low temperature in order to prepare the standard time constant circuit.

SUMMARY OF THE INVENTION

Therefore, an object of the present invention is to determine abnormality in the changeable device without using special elements and even when voltage variation of an onboard battery occurs, taking the variation of battery voltages into account. Therefore, even if the power supply that supplies power to actuating means is interrupted, the vehicle operator protection system can be activated by the chargeable device.

Accordingly, the present invention detects the charged voltage of the chargeable device and the onboard battery voltage when the chargeable device such as a backup capacitor is charged, determines the charging capability of the chargeable device while taking into account varying condition of the above-mentioned charging voltage due to the elimination of the variation of the onboard battery voltage, and determines an abnormality in the chargeable device based on its charging capability.

DETAILED DESCRIPTION OF THE PREFERRED EMBODIMENTS

An embodiment of the present invention will be described below with reference to the accompanying drawings.

According to this embodiment, at the backup capacitor constituting a time constant circuit and connected in parallel with an actuator actuating the air bag system, the voltage difference between the onboard battery and the backup capacitor is integrated for a given period during charging of the backup capacitor. The abnormality of static capacitance of the backup capacitor is determined based on the value derived from dividing the above integral value by increased potential value of the backup capacitor in a given period.

The structure of this embodiment will be explained using FIG. 1.

Figure 1:
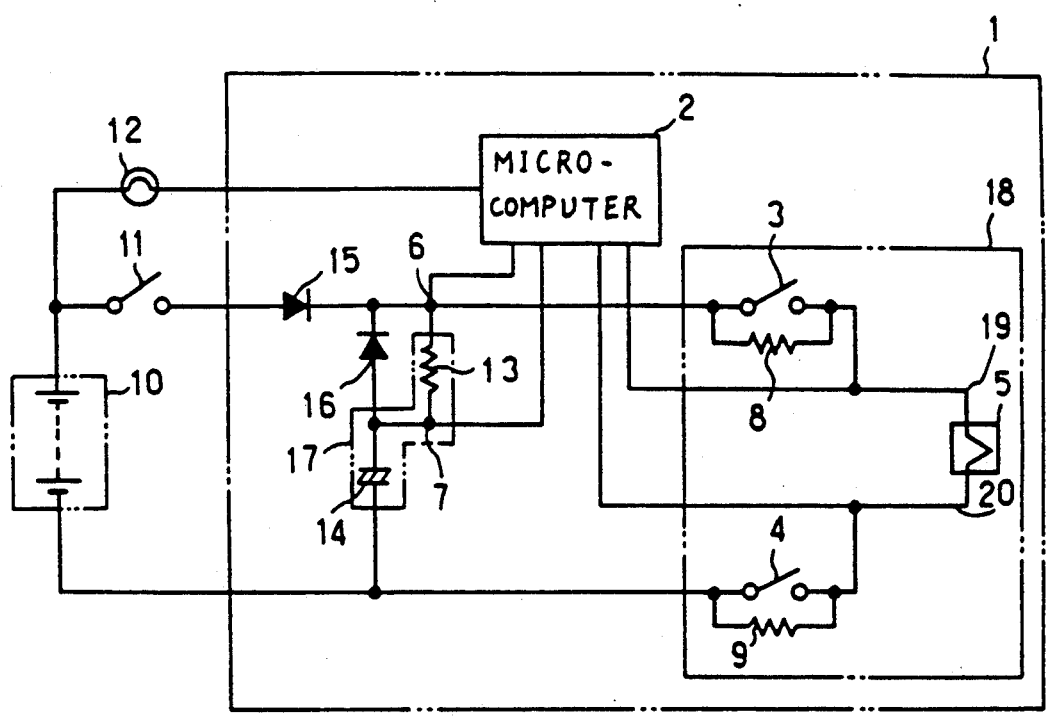
FIG. 1 is a circuit diagram of an embodiment of the present invention.

FIG. 1 is a block diagram showing an embodiment of the present invention. In FIG. 1, a battery 10 is connected to an ignition switch 11 linked with a key switch (not shown), an air bag system 1 being a vehicle operator protection system, and an indicator lamp 12 informing any vehicle operator of failures in the air bag system 1.

The air bag system 1 operates as follows.

An acceleration detection switch 3 is turned on when acceleration of the vehicle is beyond a predetermined value. The acceleration switch 3 is provided in parallel with a resistor 8. Another acceleration detection switch 4 is provided in parallel with a resistor 9. Then, the acceleration detection switch 3 and the acceleration detection switch 4 are connected to a squib 5 for inflating an air bag (not shown), and the squib 5 constitutes a triggering device.

The resistor 8 and the resistor 9 are of high resistance, and supply a current small enough as not to actuate the squib 5 when the acceleration detection switch 3 and the acceleration detection switch 4 are turned off. The above-mentioned current is used for check of malfunction of the squib 5, the acceleration detection switch 3 and the acceleration detection switch 4, which is described later.

An actuator 18 comprises the squib 5, the acceleration detection switch 3, the resistor 8, the acceleration detection switch 4, and the resistor 9 as described above.

A backup capacitor 14 and a charging resistor 13 constitute a time constant circuit 17. The backup capacitor 14 is charged through the charging resistor 13 by voltage supplied from the battery 10. The backup capacitor 14 is of large capacitance (such as approximately 4700 μF).

A diode 16 is provided so that current supplied from the battery 10 flows through the charging resistor 13 into the backup capacitor 14, and when the power supply from the battery 10 is interrupted and the backup capacitor 14 is discharged, the discharge is performed quickly.

A diode 15 is provided so that current supplied from the battery 10 flows into an actuator 18, and when the backup capacitor 14 is discharged, electric charges supplied from the backup capacitor 14 are prevented from flowing into that terminal of the battery 10.

Connection point 6 and connection point 7 are connection points of both ends of the charging resistor 13, and voltages at each connection point are detected by the microcomputer 2 to detect abnormalities in the static capacitance of the backup capacitor 14.

The microcomputer 2 determines abnormalities in the static capacitance of the backup capacitor 14 in accordance with detected voltages at the connection points 6 and 7.

Next, the operation of the above-mentioned structure will be explained.

When the ignition switch 11 is turned on, the actuator 18 is supplied with power from the battery 10 and the backup capacitor 14 is charged through the charging resistor 13.

In the event of a collision while all the circuits are in a normal condition, the acceleration detection switches 3 and 4 are turned on. As a result, the current capable of actuating the squib 5 is supplied from the battery 10. Then, the squib 5 is ignited, so that air bag (not shown) is inflated.

Even if current supplied from the battery 10 is interrupted due to impact at the time of collision, electric charges stored in the backup capacitor 14 are supplied through the diode 16 to the actuator 18, so that the air bag is inflated.

If the ignition switch 11 is turned off with each circuit in its normal condition, the air bag system 1 will be interrupted from the battery 10. Accordingly the power will no longer be supplied to the actuator 18 and the backup capacitor 14. Then, the backup capacitor 14 is discharged through the diode 16 and the actuator 18 which act as the discharge path, and decreases its own charging voltage gradually by discharging.

Next, the abnormality determination of static capacitance of the backup capacitor 14 being performed by the microcomputer 2. will be explained by describing how the above determination is performed.

Generally, charge quantity Q charged in a capacitor constituting a time constant circuit from time $t_1$ to time $t_2$ is expressed by the equation $$Q = \int_{t_1}^{t_2} i_c(t) \, dt \quad (1)$$

where $i_c(t)$ is the charging current of the capacitor at optional time t.

Where a voltage of a capacitor at optional time t is denoted by $V_c(t)$, a battery voltage charging the capacitor is denoted by $V_s(t)$, and a charging resistor constituting the time constant circuit together with the capacitor is denoted by R, the charging current $i_c(t)$ is expressed by the following equation.

$$i_c(t) = \frac{V_s(t) - V_c(t)}{R} \quad (2)$$

According to equations (1) and (2), $$Q = \frac{1}{R} \cdot \int_{t_1}^{t_2} (V_s(t) - V_c(t)) \, dt \quad (3)$$

Where the capacitor voltage at the time $t_1$ is denoted by $V_1$, the capacitor voltage at the time $t_2$ is denoted by $V_2$, and capacitance of the capacitor is denoted by C, the charge quantity Q is expressed as follows.

$$Q = C \cdot (V_2 - V_1) \quad (4)$$

From equations (3) and (4), following equation is deduced.

$$C = \frac{1}{R} \cdot \frac{1}{V_2 - V_1} \cdot \int_{t_1}^{t_2} (V_s(t) - V_c(t)) \, dt \quad (5)$$

As a charging resistor R is constant, the deterioration of electrostatic capacitance of the capacitor can be determined according to whether or not the integration of second and third terms on the right side of equation (5) is less than the predetermined constant.

Next, it will be explained that how the influences due to fluctuation of the battery voltage, which have been questionable by this time, are eliminated by determining the deterioration of electrostatic capacitance of the capacitor using the above-mentioned equations.

Figure 4:
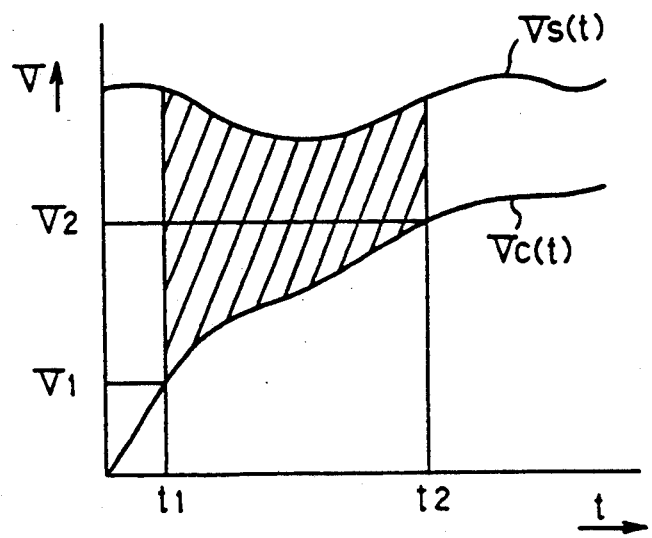
FIG. 4 is a time chart showing the voltage fluctuation of a capacitor and a charging power supply used in the above-mentioned embodiment.

FIG. 4 is a time chart showing voltage fluctuation of the capacitor 14 and the battery 10. The area enclosed by the time $t_1$, the time $t_2$, a waveform of the charging voltage $V_s(t)$, and a waveform of the capacitor voltage $V_c(t)$ as shown by the shaded portion in FIG. 4 represents the integrated value of third term on the right side of the above-mentioned equation (5).

After the integration, when the abnormality determination of the electrostatic capacitance of the capacitor is made by the above integrated value, the enclosed area (the shaded area in FIG. 4) is nearly constant when the capacitor is normal, even if the capacitor voltage $V_c(t)$ fluctuates when there are some influences due to fluctuation of the charging voltage $V_s(t)$. Therefore, any influence due to fluctuation of the supply voltage is eliminated and the abnormality determination of electrostatic capacitance of the capacitor can be done precisely.

Next, based on the above-mentioned description, it will be explained how abnormality determination of capacitance of the backup capacitor 14 is performed by the microcomputer 2, based on a flow chart showing on operation for abnormality determination of capacitance of the microcomputer 2 in FIG. 2 and a diagram showing an embodiment of the present invention in FIG. 1.

Starting the determination process, step 100 determines whether a voltage of the backup capacitor 14 is not less than a given voltage $V_1$. The voltage $V_c$ of the backup capacitor 14 is derived by detecting voltage at the connection point 7.

If the voltage $V_c$ is less than the given voltage $V_1$, determinations at step 100 are repeated, and if $V_c$ is not less than the given voltage $V_1$, the process advances to step 101a. Starting time of the abnormality determination can be set arbitrarily by the setting of the given voltage $V_1$.

At step 101a, voltage difference D is calculated between the charging voltage at that time, namely voltage $V_s$ of the battery 10 and voltage $V_c$ of the backup capacitor 14. The voltage $V_s$ of the battery 10 is derived by detecting voltage at the connection point 6, and the voltage $V_c$ of the backup capacitor 14 is derived by detecting voltage at the connection point 7. After the voltage difference D is calculated, process advances to step 101b.

At step 101b, the voltage difference D calculated at step 101a is the value SUM of arithmetic register, and process advances to step 102. The value SUM of this arithmetic register takes value 0 in the initial condition.

At step 102, it is determined whether difference between the time $t_2$ from the beginning of charging up to the present and the time $t_1$ of reaching the given voltage $V_1$ at step 100 equals a given time $C_1$.

If the given time $C_1$ has not been reached, the process returns to step 101a where the voltage difference D between the voltage $V_s$ of the battery 10 and the voltage $V_c$ of the backup capacitor 14 is calculated, and then the process proceeds to step 101b. At step 101b, the value SUM of the previous arithmetic register and the voltage difference D calculated at this time are added to achieve a new value for sum, and then the process proceeds to step 102 again. Further, the processes of step 101a, step 101b and step 102 are repeated until the given time $C_1$ has been attained. After the given time $C_1$ has been attained, the process proceeds to step 103.

The processes of step 101a, step 101b and step 102 are for making an equivalent calculation to the integration described above in the third term of the right-hand side of equation (5), that is, from the time $t_1$ to the time $t_2$.

At step 103, voltage difference between the voltage $V_2$ of the backup capacitor 14 at the time $t_2$ of attaining the given time $C_1$ and the above-mentioned given voltage $V_1$ is determine. Value SUM of the arithmretic register at the time of attaining the given time $C_1$ is divided by the voltage difference, and the divided value is made the determination value DAT and the process proceeds to step 104. The determination value DAT corresponds to the integrated value derived from the second term and the third term on the right-hand side of the above-mentioned equation (5).

At step 104, it is determined whether the determination value DAT obtained at step 103 is larger than a given value $C_2$. As a result of the decision, if the determination value DAT is larger than the given value $C_2$, the abnormality determination of capacitance is completed. If the determination value DAT is not larger than the given value $C_2$, the process proceeds to step 105 where an indicator lamp 12 is turned on, and then the abnormality determination of capacitance is completed.

Next, the entire operation of the microcomputer 2 will be explained using a flow chart showing the entire operation of the microcomputer 2 in FIG. 3. Black 1000 represents the flow chart showing the operation for abnormality determination by capacitance of the above-mentioned microcomputer 2 in FIG. 2.

When the ignition switch 11 is turned on and abnormality determination of capacitance of the backup capacitor 14 concludes at block 1000, the process proceeds to block 2000 constituted by step 200 and step 201.

Block 2000 is a malfunction detection part of the acceleration detection switch 3. Voltage of the connection point 19 is denoted by $V_+$ and voltage of the connection point 20 is denoted by $V_-$, and at step 200 it is determined whether the voltage $V_{30}$ of the connection point 19 and the voltage $V_-$ of the connection point 20 are larger than the given voltage H. The given voltage H is set at a higher voltage than that set by each resistance value of the resistors 8 and 9, when the acceleration detection switches 3 and 4 are off.

When the voltage $V_+$ of the connection point 19 and the voltage $V_-$ of the connection point 20 are larger than this given voltage H, this indicates that the acceleration detection switch 3 is on because the voltages at the connection points 19 and 20 increase due to current from the battery 10 flowing through the acceleration switch 3 having a lower resistance when acceleration switch 3 is on rather than flowing through the resistor 8 having a higher resistance when the acceleration detection switch 3 is off.

If the voltage $V_+$ of the connection point 19 and the voltage $V_-$ of the connection point 20 are lower than the above given voltage H, the process proceeds to block 3000, and if higher than the above given voltage H, the process proceeds to step 201 so that the indicator lamp 12 can be lit to indicate a malfunction.

On completing a malfunction detection of the acceleration detection switch 3 at the block 2000, the process proceeds to the block 3000 constituted by step 300 and step 301.

The block 3000 is a malfunction detecting portion of the acceleration detection switch 4 where it is determined whether the voltage $V_+$ of the connection point 19 and the voltage $V_-$ of the connection point 20 are lower than a given voltage L. The given voltage L is set to a value lower than the voltage set by each resistance of the resistors 8 and 9 when the acceleration detection switches 3 and 4 are off.

Further, if the voltage $V_+$ of the connection point 19 and the voltage $V_-$ of the connection point 20 are smaller than the given voltage L, this indicates that the acceleration detection switch 4 is on because the voltages at the connection points 19 and 20 become more negative as current supply from the battery 10 flows into the acceleration switch 4 having a low resistance when acceleration switch 4 is on rather than the resistor 8 having a high resistance when acceleration switch 4 is off.

If the voltage $V_+$ of the connection point 19 and the voltage $V_-$ of the connection point 20 are larger than the above given voltage L, the process proceeds to block 4000, and if not larger than the given voltage L, the process proceeds to step 301 so that the indicator lamp 12 can be lit to indicate a malfunction.

Upon completing a malfunction detection of the acceleration detection switch 4 at block 3000, the process proceeds to the block 4000 constituted by step 400 and step 401. The block 4000 detect an open failure in the squib 5. Here, it is determined whether the voltage $V_+$ of the connection point 19 is higher than the above given voltage H and the voltage $V_-$ of the connection point is lower than the given voltage L. As the resistance value of the squib 5 is normally about several ohms, the voltages of the connection point 19 and the connection point 20 are approximately at a middle voltage between voltages set by the resistor 8 and the resistor 9.

When the squib 5 has an failure open and its resistance value becomes more than several hundred ohms, the voltage at the connection point 19 is raised to more than the middle voltage and the voltage of the connection point 20 is lowered to less than the middle voltage. Accordingly, the open failure of the squib 5 can be detected by checking whether or not the voltage $V_+$ of the connection point 19 is larger than the above given voltage H and the voltage $V_-$ of the connection point 20 is smaller than the given voltage L.

When it is determined that the voltage $V_+$ of the connection point 19 is larger than the given voltage H and the voltage $V_-$ of the connection point 20 is smaller than the given voltage L, the process proceeds to step 401 so that the indicator lamp 12 can be lit and to indicate a malfunction. Otherwise, the process returns to step 200 and again proceeds to each malfunction detection of the block 2000, the block 3000 and block 4000.

As understood from the above explanation, the abnormality determination of capacitance of the backup capacitor 14 takes place only when the ignition switch 11 is turned on.

On the other hand, the processes of each malfunction detection of the block 2000, the block 3000 and the block 4000 are repeatedly continued while the ignition switch 11 remains on.

Next, other embodiments of the present invention will be described.

In another embodiment, the time constant circuit 17 comprising the backup capacitor 14 and the charging resistor 13 is shown as an auxiliary supply means, but a charged battery etc. may be employed. A semiconductor acceleration sensor may be used as the acceleration detection switches 3 and 4.

Figure 2:
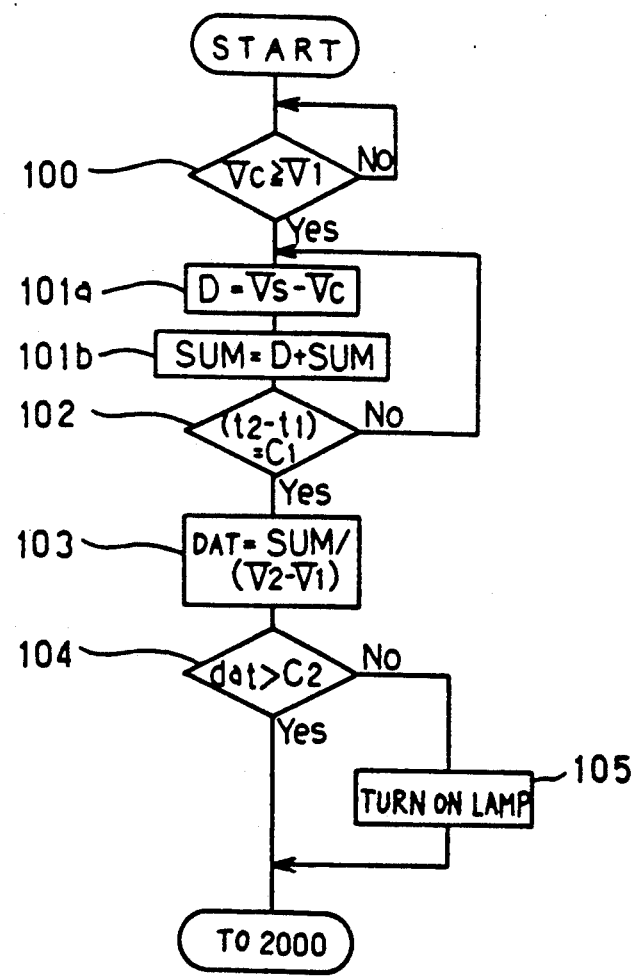
FIG. 2 is a flow chart showing operation of the microcomputer shown in FIG. 1 for determining an abnormality of static capacitance.
Figure 3:
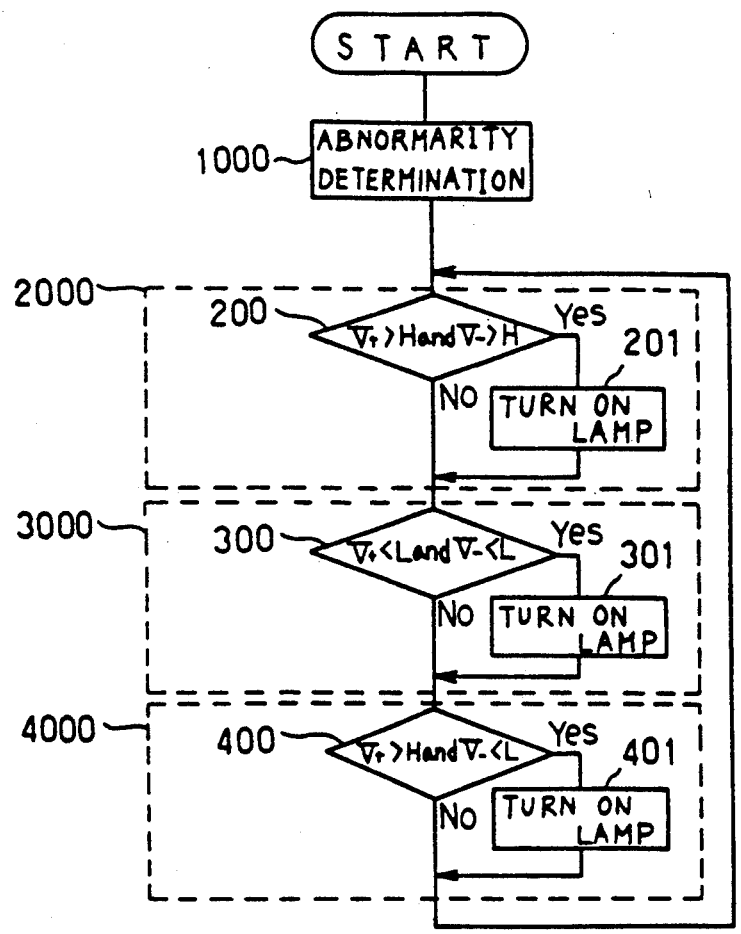
FIG. 3 is a flow chart showing a whole operation of the micro-computer shown in FIG. 1.
Figure 5:
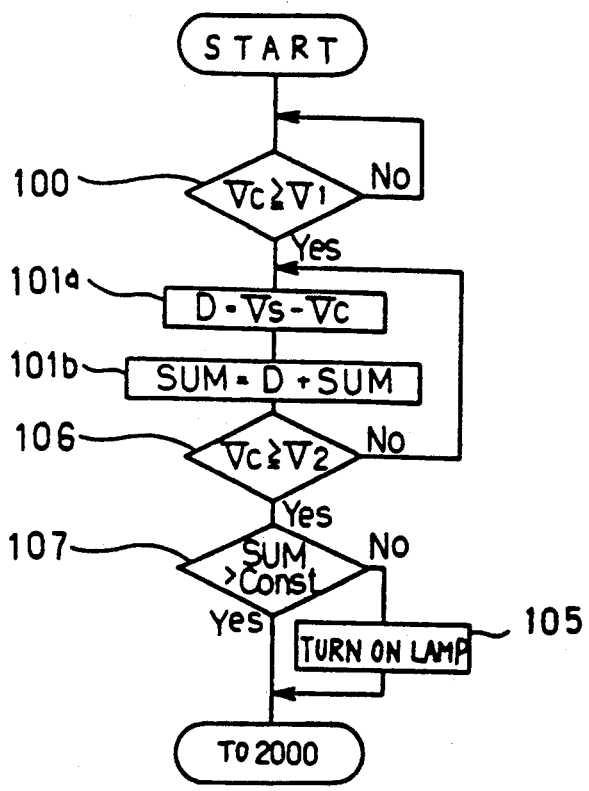
FIG. 5 is a flow chart showing operation of a microcomputer of another embodiment for determining abnormalities of static capacitance.

Further, in the flow chart of FIG. 2 showing operation of the microcomputer 2 for determining an abnormality in the capacitance of the backup capacitor 14, the integration zone as shown in step 102 is a given period, but integration may be performed in the zone from a given voltage $V_1$ to a given voltage $V_2$ as shown at step 106 in the flow chart of FIG. 5.

Then, as $V_2 - V_1$ of the second term of the right-hand side of the equation (5) is constant, the division made at step 103 in FIG. 2 is unnecessary, and at step 107 it is determined whether the value of an arithmetic register SUM is larger than a given constant $C_2$.

Figure 6:
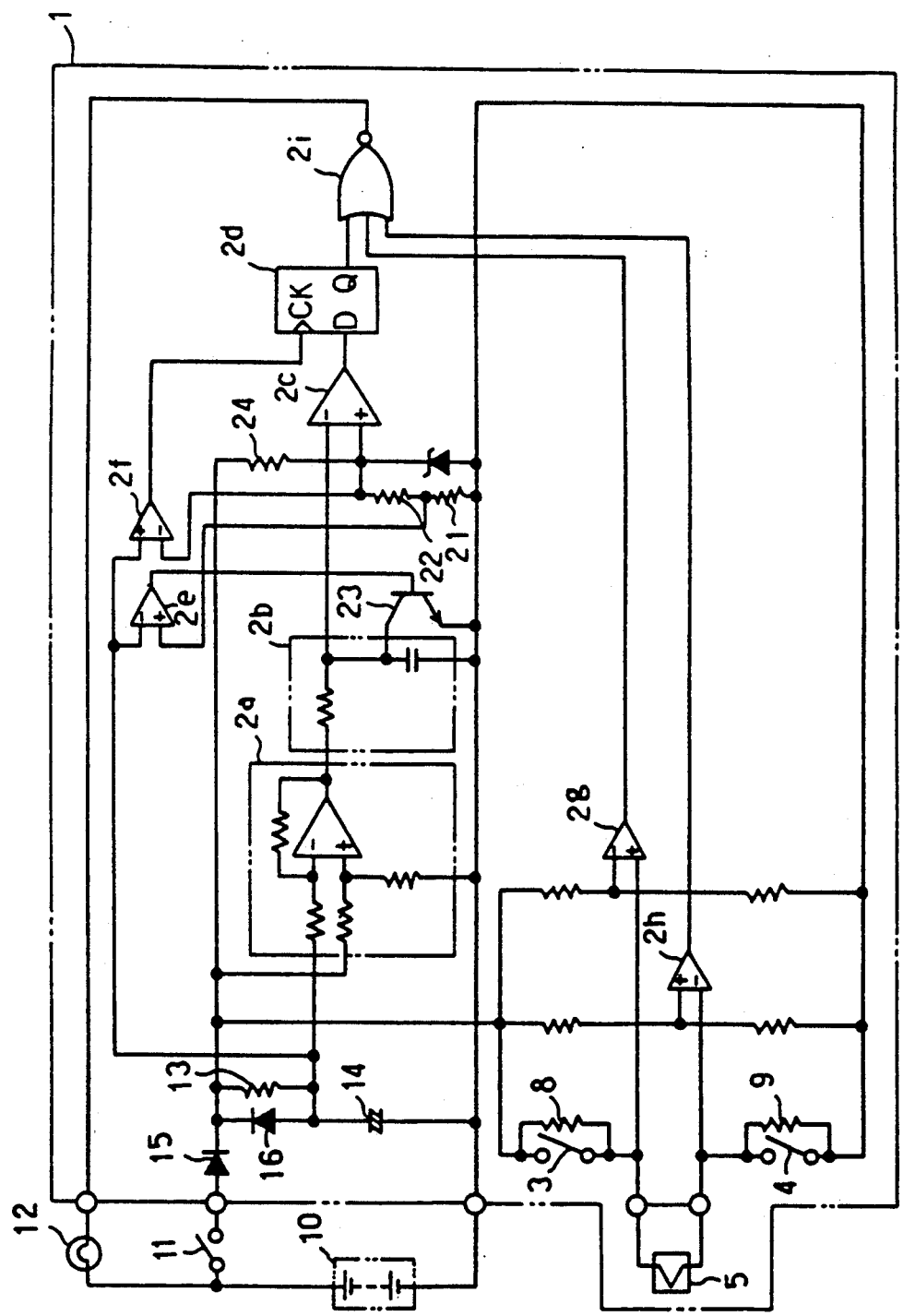
FIG. 6 is a circuit diagram of a third embodiment in which an apparatus according to the present invention is constructed by an analog circuit.

Also, the present invention can comprise analog circuits. One example is shown in FIG. 6. The parts in FIG. 6 having the same numbers as in FIG. 1 are shown to be the same and equivalent parts.

At the apparatus shown in FIG. 6, an integration method in interval from a given voltage $V_1$ to a given voltage $V_2$ as described in some of the above-mentioned embodiments has been adopted.

In FIG. 6, an integration circuit 2b integrates the output proportional to a voltage difference between both ends of a charging resistor 13, that is, the voltage difference between a backup capacitor 14 and a battery 10 derived from a differential amplifier 2a.

This integration begins after a compactor 2e outputs a low voltage and therefore a transistor 23 is turned off. That is, this comparator 2e and the transistor 23 perform the role of step 100 (FIG. 2).

A comparator 2f supplies its own output to a latch circuit 2d when the voltage of the backup capacitor 14 exceeds the voltage applied between preset resistor 22 and resistor 24 (corresponding to the above-mentioned given voltage $V_2$).

Therefore, the abnormality the capacitance is determined by the latch circuit 2d by latching the comparison of integration results, small and large, carried out by a comparator 2c at the time when the comparator 2f supplies its own output.

Comparators 2g and 2h shown in FIG. 6 are circuits for detecting malfunction of the acceleration detection switches 3 and 4.

The result of this malfunction detection circuit and the result of determination of reduction of the above-mentioned capacitance are output to an OR circuit 2i so that an indicator lamp 12 can be lit when the malfunction has occured.

What is claimed is:

1. An operator protection system for use with a vehicle, comprising:
 a battery having a battery voltage stored therein for providing electric power and being mounted on said vehicle;
 means, supplied with said electric power, for actuating an operator protection device at a predetermined time, said actuating means comprising:
  means for detecting a collision of said vehicle; and
  a squib for actuating an air bag when said collision is detected;
 auxiliary power supply means, charged by said battery to attain a charging voltage, for supplying backup electric power to said actuating means when said electric power being supplied by said battery to said actuating means is interrupted, said auxiliary power supply means comprising a capacitor;
 means for determining a predetermined condition of said auxiliary power supply means, comprising:
  means for detecting a magnitude of said charging voltage being stored in said auxiliary power supply means and a magnitude of said battery voltage of said battery during a period when said battery is charging said auxiliary power supply means such that variations in said battery voltage do not affect said charging voltage;
  means for calculating, during a predetermined period of time, a plurality of voltage differences between said magnitude of said charging voltage and said magnitude of said battery voltage; and
  means for adding said voltage differences to calculate a value representing a charging capability of said auxiliary power supply means;

said determining means determining said predetermined condition of said auxiliary power supply means in accordance with said value.

2. An operator protection system according to claim 1, said predetermined period of time beginning when said magnitude of said charging voltage reaches a predetermined value.

3. An operator protection system according to claim 1, said predetermined period of time beginning when said magnitude of said charging voltage reaches a first predetermined value and ending when said magnitude of said charging voltage reaches a second predetermined value.

4. An operator protection system according to claim 1, further comprising means for notifying an operator of said vehicle of said predetermined condition when said determining means determines said predetermined condition.

5. An operator protection system according to claim 4, further comprising:
   an electrical path for directing said electric power to said actuating means; and
   means for regulating said electric power being provided to said actuating means to provide a predetermined current to terminals of said squib to prevent said squib from actuating said air bag when said collision detecting means does not detect said collision; and
   said determining means further comprising checking means for detecting a voltage across said terminals of said squib when said predetermined current is provided to said terminals to determine a predetermined condition of said electrical path.

6. An operator protection system according to claim 5, said checking means repeatedly determining said predetermined condition of said electrical path after said determining means determines said predetermined condition of said auxiliary power supply means.

7. An operator protection system according to claim 6, said notifying means notifying said operator of said predetermined condition of said electrical path when said checking means determines said predetermined condition of said electrical path.

8. An operator protection system for use with a vehicle, comprising:
   a battery, mounted on said vehicle, for supplying electric power;
   a squib for actuating an air bag on said vehicle;
   means for detecting a collision of said vehicle comprising means for providing an electrical path from said battery to said squib to enable said electric power to be supplied to said squib to cause said squib to actuate said air bag when said collision detecting means detects said collision;
   a backup capacitor, being charged by said electric power to attain a charging voltage, for supplying backup electric power to said squib when said electric power being supplied to said squib by said battery is interrupted;
   a resistor, having first and second terminals and coupled to said electrical path and said backup capacitor, for forming a charging path to enable said battery to charge said backup capacitor;
   a diode, provided between said electrical path and said backup capacitor, to form a discharge path to provide said backup electric power from said backup capacitor to said electrical path; and means for determining a predetermined condition of said backup capacitor comprising:
   means for detecting magnitudes of first and second voltages at said first and second terminals of said resistor, respectively, when said backup capacitor is being charged;
   means for calculating, during a predetermined period of time, a difference between said magnitudes of said first voltages and said magnitudes of said second voltages; and
   means for adding said plurality of voltage differences to calculate a value;
   said determining means determining said predetermined condition of said backup capacitor in accordance with said value.

9. An operator protection system according to claim 8, said predetermined period of time beginning when a magnitude of said charging voltage reaches a predetermined value.

10. An operator protection system according to claim 8, said predetermined period of time beginning when a magnitude of said charging voltage reaches a first predetermined value and ending when said magnitude of said charging voltage reaches a second predetermined value.

11. An operator protection system according to claim 10, further comprising means for notifying an operator of said vehicle of said predetermined condition of said backup capacitor when said determining means determines said predetermined condition.

12. An operator protection system for use with a vehicle, comprising:
   a battery having a battery voltage stored therein for providing electric power and being mounted on said vehicle;
   actuating means, supplied with said electric power, for actuating an operator protection device at a predetermined time, said actuating means comprising:
      means for detecting a collision of said vehicle; and
      a squib for actuating an air bag when said collision is detected;
   an electrical path for directing said electric power to said actuating means;
   means for regulating said electric power being provided to said actuating means to provide a predetermined current to terminals of said squib to prevent said squib from actuating said air bag when said collision detecting means does not detect said collision;
   auxiliary power supply means, charged by said battery, for supplying backup electric power to said actuating means when said electric power being supplied by said battery to said actuating means is interrupted, said auxiliary power supply means comprising a capacitor;
   means for determining a predetermined condition of said auxiliary power supply means, comprising:
      means for detecting a magnitude of a charging voltage being stored in said auxiliary power supply means and a magnitude of said battery voltage of said battery during a period when said battery is charging said auxiliary power supply means such that variations in said battery voltage do not affect said charging voltage to determine a charging capability of said auxiliary power supply means; and checking means for detecting a voltage across said terminals of said squib when said predetermined current is provided to said terminals to determine a predetermined condition of said electrical path, said determining means determining said predetermined condition of said auxiliary power supply means in accordance with said charging capability; and means for notifying an operator of said vehicle of said predetermined condition when said determining means determines said predetermined condition of said auxiliary power supply means.

13. An operator protection system according to claim 12, said checking means repeatedly determining said predetermined condition of said electrical path after said determining means determines said predetermined condition of said auxiliary power supply means.

14. An operator protection system according to claim 13, said notifying means notifying said operator of said predetermined condition of said electrical path when said checking means determines said predetermined condition of said electrical path.

* * * * *